(12) United States Patent
Akatsuka et al.

(10) Patent No.: US 11,631,794 B2
(45) Date of Patent: Apr. 18, 2023

(54) THERMOELECTRIC MATERIAL, THERMOELECTRIC DEVICE, POWDER FOR THERMOELECTRIC MATERIAL, AND METHOD FOR PRODUCING THERMOELECTRIC MATERIAL

(71) Applicant: NIPPON SHOKUBAI CO., LTD., Osaka (JP)

(72) Inventors: Takeo Akatsuka, Hyogo (JP); Hironobu Ono, Hyogo (JP); Shinya Maenosono, Ishikawa (JP); Mikio Koyano, Ishikawa (JP)

(73) Assignee: NIPPON SHOKUBAI CO., LTD., Osaka (JP)

( * ) Notice: Subject to any disclaimer, the term of this patent is extended or adjusted under 35 U.S.C. 154(b) by 865 days.

(21) Appl. No.: 16/301,954

(22) PCT Filed: Apr. 28, 2017

(86) PCT No.: PCT/JP2017/017059
§ 371 (c)(1),
(2) Date: Nov. 15, 2018

(87) PCT Pub. No.: WO2017/203938
PCT Pub. Date: Nov. 30, 2017

(65) Prior Publication Data
US 2019/0189883 A1  Jun. 20, 2019

(30) Foreign Application Priority Data

May 25, 2016 (JP) .............................. JP2016-104667
Aug. 25, 2016 (JP) .............................. JP2016-164215
Mar. 2, 2017 (JP) .............................. JP2017-039037

(51) Int. Cl.
C22C 1/04 (2023.01)
C22C 9/02 (2006.01)
(Continued)

(52) U.S. Cl.
CPC .............. *H01L 35/16* (2013.01); *B22F 1/054* (2022.01); *B22F 3/105* (2013.01); *B22F 9/24* (2013.01);
(Continued)

(58) Field of Classification Search
CPC ....... C22C 1/0425; C22C 1/0483; C22C 9/02; B22F 1/0018; B22F 2301/10;
(Continued)

(56) References Cited

U.S. PATENT DOCUMENTS

2003/0056819 A1    3/2003  Imai et al.
2012/0288987 A1*  11/2012  Radu ................... C01G 19/006
                                                                  438/95

FOREIGN PATENT DOCUMENTS

JP   2002270907 A   9/2002
JP   2003188425 A   7/2003
(Continued)

OTHER PUBLICATIONS

Xi et al., "Chemical bonding, conductive network, and thermoelectric performance of the ternary semiconductors Cu2SnX3 (X=Se,S) from first principles", Oct. 1, 2012, Physical Review B, 86, pp. 155201-1 to 155201-14. (Year: 2012).*

(Continued)

*Primary Examiner* — Matthew E. Hoban
*Assistant Examiner* — Lynne Edmondson
(74) *Attorney, Agent, or Firm* — Hamre, Schumann, Mueller & Larson, P.C.

(57) ABSTRACT

A thermoelectric material of the present invention includes copper, tin, and sulfur, wherein a ratio A/B of the number A of copper atoms to the number B of tin atoms is 0.5 to 2.5 and a content of a metal element other than copper and tin is 5 mol % or less with respect to total metal elements. Additionally, the thermoelectric material of the present (Continued)

invention has a thermal conductivity less than 1.0 W/(m·K) at 200 to 400° C.

13 Claims, 9 Drawing Sheets

(51) Int. Cl.
  *B22F 9/24*    (2006.01)
  *H01L 35/16*   (2006.01)
  *C01G 19/00*   (2006.01)
  *B22F 3/105*   (2006.01)
  *C04B 35/547*   (2006.01)
  *H01L 35/34*   (2006.01)
  *B22F 9/30*    (2006.01)
  *B22F 1/054*   (2022.01)

(52) U.S. Cl.
  CPC .............. *B22F 9/30* (2013.01); *C01G 19/006* (2013.01); *C04B 35/547* (2013.01); *C22C 1/0425* (2013.01); *C22C 1/0483* (2013.01); *C22C 9/02* (2013.01); *H01L 35/34* (2013.01); *B22F 2201/10* (2013.01); *B22F 2301/10* (2013.01); *B22F 2301/30* (2013.01); *B22F 2302/45* (2013.01); *B22F 2304/054* (2013.01); *C01P 2002/72* (2013.01); *C01P 2004/04* (2013.01); *C01P 2004/51* (2013.01); *C01P 2004/64* (2013.01); *C01P 2006/32* (2013.01)

(58) Field of Classification Search
  CPC .... B22F 2301/30; B22F 9/24; B22F 2201/10; B22F 2304/054; H01L 35/16; H01L 35/34; C01P 2006/32; C01P 2004/64
  See application file for complete search history.

(56) References Cited

FOREIGN PATENT DOCUMENTS

| | | |
|---|---|---|
| JP | 2012059947 A | 3/2012 |
| JP | 2013512311 A | 4/2013 |
| JP | 2015017000 A | 1/2015 |
| JP | 2016004988 A | 1/2016 |
| JP | 2016039372 A | 3/2016 |
| JP | 2016048730 A | 4/2016 |
| WO | 2011066205 A1 | 6/2011 |

OTHER PUBLICATIONS

Bourges et al., by "Low thermal conductivity in ternary Cu4Sn7S16 compound". Jul. 13, 2015, Acta Materiala 97, pp. 180-190. (Year: 2015).*

Shen et al., "Eco-friendly p-type Cu2SnS3 thermoelectric material: crystal structure and transport properties", Nature, Scientific Reports, pp. 1-8. (Year: 2016).*

Zhao et al., "Development of plasmonic semiconductor nanomaterials with copper chalcogenides for a future with sustainable energy materials", Energy & Environmental Science, 5, pp. 5564-5576. (Year: 2012).*

"Multi-Scale Structured Thermoelectric Materials of Copper Sulfide System by Panoscopic Approach," Proceedings of Lectures at the 67th Divisional Meeting of Division of Colloid and Surface Chemistry, p. 485 (Published on Sep. 8, 2016 and presented at the meeting on Sep. 24, 2016).

"Wet-Chemical Synthesis of Transition Metal Sulfide Nanoparticles as a Sustainable Thermoelectric Material," Proceedings of the 2016 MRS Fall Meeting & Exhibit Session ES4.3 (Published on Nov. 3, 2016 and presented at the meeting on Nov. 29, 2016).

"Thermoelectric Characteristics of Transition Metal Sulfide Nano-Bulk Materials," Proceedings of the 2016 MRS Fall Meeting & Exhibit Session ES4.5 (Published on Nov. 3, 2016 and presented at the meeting on Nov. 29, 2016).

"Thermoelectric Properties of the Copper Sulfide System using Multi-Scale Structuring Based on the Panoscopic Approach," Proceedings of the 97th Chemical Society of Japan Meeting (Published on Mar. 3, 2017 and presented at the meeting on Mar. 16, 2017).

Suekuni, K. et al., "High-performance thermoelectric mineral Cu12-xNixSb4S13 tetrahedrite," Journal of Applied Physics, 2013, vol. 113, pp. 043712-1-043712-5 (View online: http://dx.doi.org/10.1063/1.4789389).

Suekuni, K. et al., "High-performance thermoelectric minerals: Colusites Cu26V2M6S32 (M=Ge, Sn)," Applied Physics Letters, 2014, vol. 105, pp. 132107-1-132107-4 (View online: http://dx.doi.org/10.1063/1.4896998).

Goto, Y. et al., "Effect of Indium Substitution on the Thermoelectric Properties of Orthorhombic Cu4SnS4," Journal of Electronic Materials, 2014, vol. 43, No. 6, pp. 2202-2205.

Yang, H. et al., "Nontoxic and Abundant Copper Zinc Tin Sulfide Nanocrystals for Potential High-Temperature Thermoelectric Energy Harvesting," Nano Letters, 2012, vol. 12, No. 2, pp. 540-545.

International Search Report issued for International Patent Application No. PCT/JP2017/017059, dated Jun. 27, 2017, 5 pages including English translation.

* cited by examiner

THERMOELECTRIC MATERIAL, THERMOELECTRIC DEVICE, POWDER FOR THERMOELECTRIC MATERIAL, AND METHOD FOR PRODUCING THERMOELECTRIC MATERIAL

TECHNICAL FIELD

The present invention relates to a thermoelectric material, thermoelectric conversion device, powder for a thermoelectric material, and method for producing a thermoelectric material.

BACKGROUND ART

Conventionally there are known thermoelectric materials that convert thermal energy into electrical energy by using the Seebeck effect in which voltage is generated by a temperature difference between two ends of the materials, or that use electrical energy to cause a temperature difference by using the Peltier effect. As thermoelectric materials, there are n-type thermoelectric materials that generate an electric current by electron transfer from the high-thermal energy side to the low-thermal energy side and p-type thermoelectric materials generating an electric current by hole transfer from the high-thermal energy side to the low-thermal energy side.

Sulfides have been attracting attention in recent years as thermoelectric materials. Sulfides including copper and another metal especially have been attracting attention as thermoelectric materials. For example, Non Patent Literatures 1 to 4 have respectively reported thermoelectric properties of $Cu_{12-x}Ni_xSb_4S_{13}$ tetrahedrite, $Cu_{26}V_2M_6S_{32}$ (M=Ge or Sn), $Cu_4In_xSn_{1-x}S_4$ (x=0-0.02), and a sulfide (CZTS) including copper, zinc, and tin. Patent Literatures 1 and 2 describe thermoelectric materials which are sulfides including copper and titanium. Such sulfides including copper and a certain metal other than copper have properties desired for use as thermoelectric materials.

CITATION LIST

Patent Literature

Patent Literature 1: JP 2002-270907 A
Patent Literature 2: JP 2003-188425 A

Non Patent Literature

Non Patent Literature 1: Journal of Applied Physics, US, 2013, Vol. 113, 043712
Non Patent Literature 2: Applied Physics Letters, US, 2014, Vol. 105, 132107
Non Patent Literature 3: The Journal of Electronic Materials, US, 2014, Vol. 43, No. 6, pp. 2202-2205
Non Patent Literature 4: Nano Letters, US, 2012, Vol. 12, No. 2, pp. 540-545

SUMMARY OF INVENTION

Technical Problem

For improvement of thermoelectric properties of thermoelectric materials, it is desirable that the thermoelectric materials have low thermal conductivity. Low thermal conductivity at 200 to 400° C. is particularly desirable in view of an environment where the thermoelectric materials are used. Depending on the environment where the thermoelectric materials are used, it is desirable that the thermoelectric material have low lattice thermal conductivity at 80 to 200° C.

According to Non Patent Literature 1, $Cu_{12-x}Ni_xSb_4S_{13}$ tetrahedrite where x is 1.5 has a thermal conductivity less than 1.0 W/(m·K) at 200 to 400° C. (about 473 to 673 K) and a relatively high non-dimensional figure of merit ZT. According to Non Patent Literature 2, $Cu_{26}V_2M_6S_{32}$ (M=Ge or Sn) has a thermal conductivity less than 1.0 W/(m·K) at 200 to 400° C. The materials according to Non Patent Literatures 1 and 2, however, need to include a toxic metal such as antimony (Sb) or vanadium (V).

According to Non Patent Literature 3, from which the thermal conductivity of $Cu_4In_xSn_{1-x}S_4$ (x=0-0.02) at 200 to 400° C. is unknown, when x=0, that is, when the sulfide is $Cu_4SnS_4$, the thermal conductivity thereof is more than 3.0 W/(m·K) at 300 K and increases with a rise in temperature. According to Non Patent Literature 4, the thermal conductivity of CZTS is more than 1.0 W/(m·K) at 200 to 400° C. The sulfides described in Patent Literatures 1 and 2 and including copper and titanium have a thermal conductivity more than 1.0 W/(m·K) at room temperature (28° C.) and 700° C. Incidentally, Indium (In) is toxic.

In view of the above circumstances, the present invention aims to provide a thermoelectric material having a low thermal conductivity at 200 to 400° C. or low lattice thermal conductivity at 80 to 200° C. by using copper and a relatively less toxic metal. The present invention aims to provide a thermoelectric conversion device including such a thermoelectric material. The present invention aims to provide a powder suitable for producing such a thermoelectric material. The present invention aims to provide a method for producing such a thermoelectric material.

Solution to Problem

The present invention provides a thermoelectric material, including copper, tin, and sulfur, wherein
a ratio A/B of the number A of copper atoms to the number B of tin atoms is 0.5 to 2.5,
a content of a metal element other than copper and tin is 5 mol % or less with respect to total metal elements, and
the thermoelectric material has a thermal conductivity less than 1.0 W/(m·K) at 200 to 400° C.

The present invention provides a thermoelectric material, including copper, tin, and sulfur, wherein
a ratio A/B of the number A of copper atoms to the number B of tin atoms is 0.5 to 2.5,
a content of a metal element other than copper and tin is 5 mol % or less with respect to total metal elements, and
the thermoelectric material has a lattice thermal conductivity less than 0.8 W/(m·K) at 80 to 200° C.

The present invention provides a thermoelectric conversion device, including:
any one of the thermoelectric material as defined above; and
a conductor connected to the thermoelectric material.

The present invention provides a powder for a thermoelectric material, including copper, tin, and sulfur, wherein
a ratio A/B of the number A of copper atoms to the number B of tin atoms is 0.5 to 2.5,
a content of a metal element other than copper and tin is 5 mol % or less with respect to total metal elements, and
the powder for a thermoelectric material includes particles having a particle diameter of 100 nm or less in an amount of 80% or more on a number basis.

The present invention also provides a method for producing a thermoelectric material, including:

adding a copper compound, a tin compound, and a sulfur compound or a simple substance of sulfur to water under stirring to prepare a liquid mixture so that a ratio A/B of the number A of copper atoms to the number B of tin atoms is 0.5 to 2.5; and placing the liquid mixture in an environment having a temperature of 150 to 300° C. and a pressure of 0.5 to 9 MPa for a predetermined period of time to carry out hydrothermal synthesis of a thermoelectric material.

The present invention further provides a method for producing a thermoelectric material, including:

preparing a liquid mixture including a copper compound, a tin compound, and a sulfur compound and/or a simple substance of sulfur in an organic solvent so that a ratio A/B of the number A of copper atoms to the number B of tin atoms is 0.5 to 2.5; and placing the liquid mixture in an environment filled with an inert gas and having a temperature of 150 to 350° C. for a predetermined period of time to carry out synthesis of a thermoelectric material.

Advantageous Effects of Invention

According to the present invention, a thermoelectric material having a low thermal conductivity less than 1.0 W/(m·K) at 200 to 400° C. can be provided by using copper and a relatively less toxic metal. Additionally, a thermoelectric material having such a property can be advantageously produced.

DESCRIPTION OF EMBODIMENTS

Figure 1A:
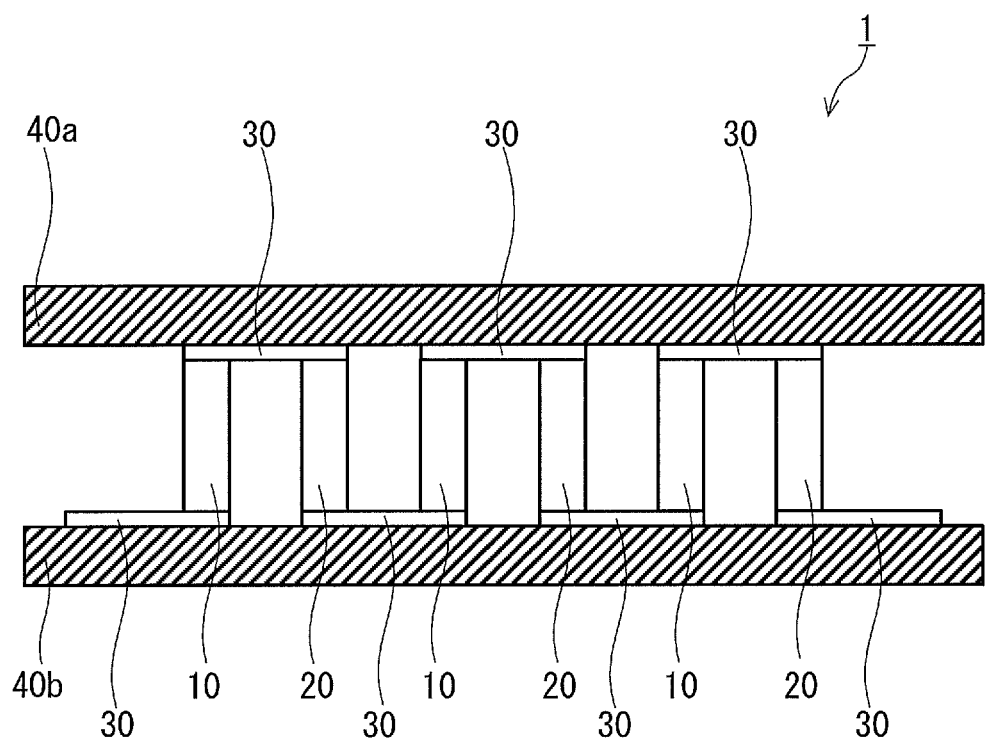
FIG. 1A is a cross-sectional view showing an exemplary thermoelectric conversion device according to the present invention.

Embodiments of the present invention will be described hereinafter. The following description relates to examples of the present invention, and the present invention is not limited to the examples.

First Embodiment

A thermoelectric material according to a first embodiment of the present invention includes copper, tin, and sulfur. That is, the thermoelectric material according to the first embodiment of the present invention is a composite metal sulfide. The thermoelectric material is not limited to a particular composite metal sulfide and may be crystalline or amorphous. When the thermoelectric material is crystalline, its crystal structure is not particularly limited and may be, for example, a zinc blende structure, wurtzite structure, or any other structure. When the thermoelectric material is crystalline, it is desirable that its crystal structure at least include either a zinc blende structure or wurtzite structure, or both. In this case, the crystal of the thermoelectric material is stable at temperatures ranging from ordinary temperature to about 400° C. In the thermoelectric material according to the first embodiment of the present invention, a ratio A/B of the number A of copper atoms to the number B of tin atoms is 0.5 to 2.5. The ratio A/B is desirably 1 to 2.5, and more desirably 1.7 to 2.3. In the thermoelectric material according to the first embodiment of the present invention, a content of a metal element other than copper and tin is 5 mol % or less with respect to total metal elements. In the thermoelectric material according to the first embodiment of the present invention, the content of a metal element other than copper and tin is, for example, 4 mol % or less with respect to total metal elements. The thermoelectric material according to the first embodiment of the present invention may be substantially free of any metal element other than copper and tin. The thermoelectric material according to the first embodiment of the present invention has a thermal conductivity less than 1.0 W/(m·K) at 200 to 400° C. The term "substantially free" of a certain metal element as used herein means that the certain metal is not incorporated intentionally, although the certain metal element may be inevitably introduced for production-related causes such as a raw material or production facility.

Since the content of a metal element other than copper and tin is 5 mol % or less, the thermoelectric material according to the first embodiment of the present invention is almost free of toxic metal elements. Copper and tin are virtually non-toxic metal elements as can be seen from their use in tableware. Desirably, the thermoelectric material is substantially free of antimony, vanadium, and indium. More desirably, the thermoelectric material is completely free of antimony, vanadium, and indium.

Non-dimensional figure of merit ZT is known as one of the indices of performance of thermoelectric materials. Here, Z represents a figure of merit and has $K^{-1}$ dimensions. The symbol T represents the absolute temperature. The larger the non-dimensional figure of merit ZT is, the better performance thermoelectric materials exhibit. The non-dimensional figure of merit ZT of thermoelectric materials is defined by the following equation (1). The symbols α, σ, and κ respectively refer to the Seebeck coefficient, electrical conductivity, and thermal conductivity of thermoelectric materials.

$$ZT=\alpha^2\sigma T/\kappa \tag{1}$$

As can be understood from the equation (1), a decrease in thermal conductivity is desirable to improve the non-dimensional figure of merit ZT of thermoelectric materials. The thermoelectric material according to the present invention has a thermal conductivity less than 1.0 W/(m·K) at 200 to 400° C., which means that the thermoelectric material has a desirable thermal conductivity in terms of achieving high thermoelectric performance.

The thermoelectric material according to the first embodiment preferably has a crystal grain size of, for example, 100 nm or less. Specifically, the mean crystal grain size of particles composing the thermoelectric material, as determined on a number basis, is preferably 5 nm or more and 100 nm or less. Even more preferably, 80% or more of the particles composing the thermoelectric material have a crystal grain size of 100 nm or less. This is likely to enable the thermoelectric material according to the first embodiment to more reliably achieve a thermal conductivity less than 1.0 W/(m·K) at 200 to 400° C. The crystal grain size of the thermoelectric material can be determined through observation of crystal grain boundaries of the thermoelectric material by, for example, high-angle annular dark-field scanning transmission electron microscopy (HAADF-STEM) or measurement of an orientation mapping image of an electron backscatter diffraction (EBSD) pattern. The crystal grain size of each particle is an equivalent circle diameter.

Second Embodiment

A thermoelectric material according to a second embodiment of the present invention includes copper, tin, and sulfur. That is, the thermoelectric material according to the second embodiment is a composite metal sulfide. The thermoelectric material is not limited to a particular composite metal sulfide and may be crystalline or amorphous. When the thermoelectric material is crystalline, its crystal structure is not particularly limited and may be, for example, a zinc blende structure, wurtzite structure, or any other structure. When the thermoelectric material is crystalline, it is desirable that its crystal structure at least include either a zinc blende structure or wurtzite structure, or both. In this case, the crystal of the thermoelectric material is stable at temperatures ranging from ordinary temperature to about 400° C. In the thermoelectric material according to the second embodiment, a ratio A/B of the number A of copper atoms to the number B of tin atoms is 0.5 to 2.5. The ratio A/B is desirably 1 to 2.5, and more desirably 1.7 to 2.3. In the thermoelectric material according to the second embodiment of the present invention, a content of a metal element other than copper and tin is 5 mol % or less with respect to total metal elements. The thermoelectric material according to the second embodiment has a lattice thermal conductivity less than 0.8 W/(m·K) at 80 to 200° C.

The thermal conductivity κ in the equation (1) can be expressed as the sum of the carrier thermal conductivity κcar and lattice thermal conductivity κlat. It is particularly desirable to decrease the lattice thermal conductivity κlat which is a physical property parameter having no correlation with the electrical conductivity to improve performance of thermoelectric materials. Having a lattice thermal conductivity less than 0.8 W/(m·K) at 80 to 200° C., the thermoelectric material according to the second embodiment is likely to exhibit high performance.

In the thermoelectric material according to the second embodiment, the content of a metal element other than copper and tin is desirably 1 to 5 mol %, more desirably 1 to 4 mol %, and even more desirably 2 to 4 mol % with respect to total metal elements. Such a content makes it easy to decrease the lattice thermal conductivity κlat of the thermoelectric material without greatly impairing the electrical conductivity of the thermoelectric material. For example, if the content of a metal element other than copper and tin exceeds 5 mol % with respect to total metal elements, the crystal structure may change and thus the electrical conductivity may decrease. If the content of a metal element other than copper and tin is less than 1 mol % with respect to total metal elements, the electrical conductivity may decrease and thus the performance as a thermoelectric material may decrease.

When the thermoelectric material according to the second embodiment includes a metal element other than copper and tin, the metal element is, for example, at least one element selected from the group consisting of iron, zinc, cobalt, nickel, and manganese. This makes it easy to more reliably decrease the lattice thermal conductivity κlat of the thermoelectric material. The thermoelectric material according to the second embodiment desirably includes at least one of iron, cobalt, and zinc as a metal element other than copper and tin.

Typically, the thermoelectric material according to the second embodiment is substantially free of antimony, vanadium, and indium. Desirably, the thermoelectric material according to the second embodiment is completely free of antimony, vanadium, and indium. The thermoelectric material according to the second embodiment may be substantially free of any metal element other than copper and tin.

The thermoelectric material according to the second embodiment preferably has a crystal grain size of, for example, 100 nm or less. Specifically, the mean crystal grain size of particles composing the thermoelectric material, as determined on a number basis, is preferably 5 nm or more and 100 nm or less. Even more preferably, 80% or more of the particles composing the thermoelectric material have a crystal grain size of 100 nm or less. This is likely to enable the thermoelectric material according to the second embodiment to more reliably achieve a lattice thermal conductivity less than 0.8 W/(m·K) at a relatively low temperatures, i.e., 80 to 200° C. This is explained by the fact that when the crystal grain size is large, the κlat is in proportion to the inverse of the temperature and scattering by an Umklapp process is dominant, while when the crystal grain size is as small as 100 nm or less, the κlat is not in proportion to the inverse of the temperature and short-wavelength phonons are properly scattered by nanograins. The crystal grain size of each particle is an equivalent circle diameter.

<Thermoelectric Conversion Device>

A thermoelectric conversion device can be produced using the thermoelectric material according to the first embodiment or second embodiment. The thermoelectric conversion device includes, for example, the thermoelectric material according to the first embodiment or second embodiment and a conductor connected to the thermoelectric material.

As shown in FIG. 1A, a thermoelectric conversion device 1 includes, for example, a plurality of first thermoelectric materials 10, a plurality of second thermoelectric materials 20 disposed alternately with the first thermoelectric materials 10, and conductors 30 connecting the first thermoelectric materials 10 to the adjacent second thermoelectric materials 20. The plurality of first thermoelectric materials 10 and the plurality of second thermoelectric materials 20 are, for example, serially connected by the conductors 30. The first thermoelectric materials 10 are each the thermoelectric material according to the first embodiment or second embodiment. The second thermoelectric materials 20 are each a known n-type semiconductor usable in thermoelectric conversion devices. As shown in FIG. 1A, the conductors 30 are disposed, for example, on a substrate 40a or substrate 40b. Both the substrate 40a and substrate 40b are, for example, ceramic substrates having a high thermal conductivity.

Figure 1B:
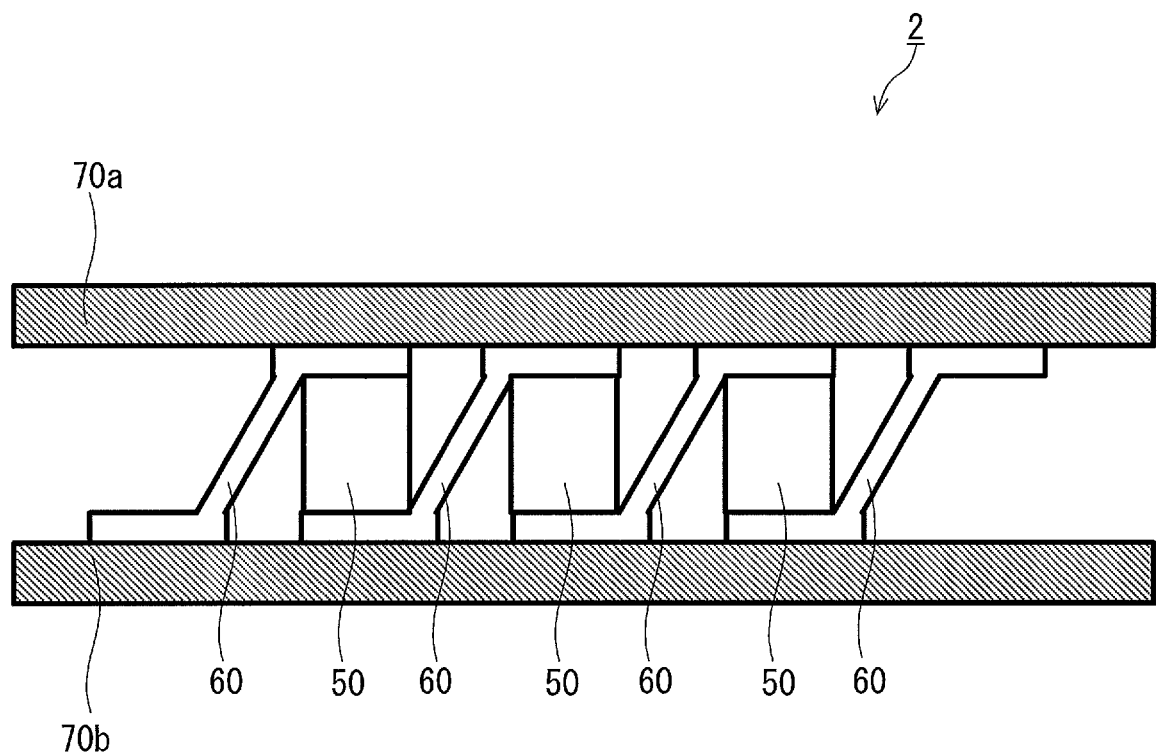
FIG. 1B is a cross-sectional view showing another exemplary thermoelectric conversion device according to the present invention.
Figure 2A:
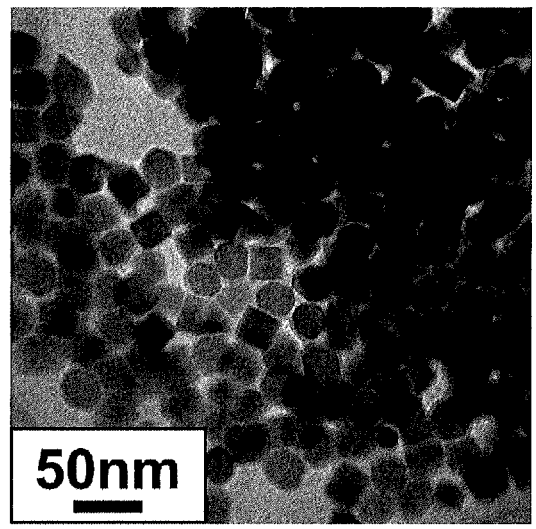
FIG. 2A is a transmission electron microscopy (TEM) image of a powder for a thermoelectric material according to Example 2.
Figure 2B:
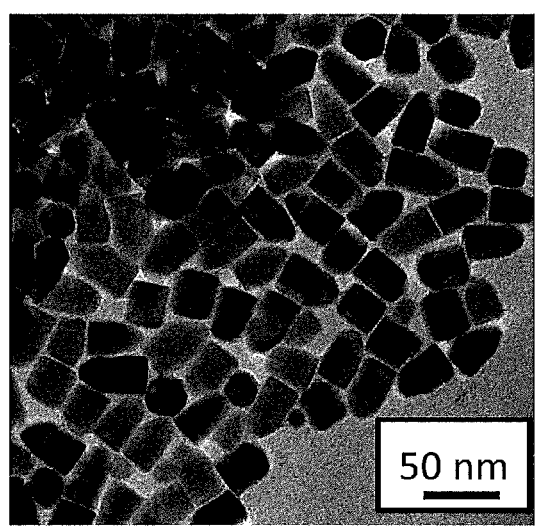
FIG. 2B is a TEM image of a powder for a thermoelectric material according to Example 3.
Figure 2C:
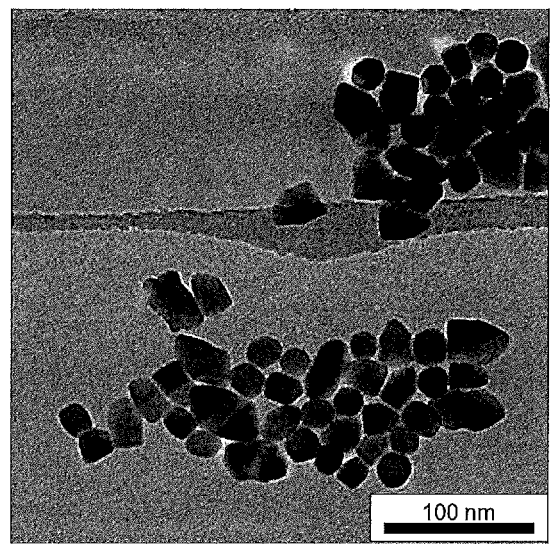
FIG. 2C is a TEM image of a powder for a thermoelectric material according to Example 4.
Figure 2D:
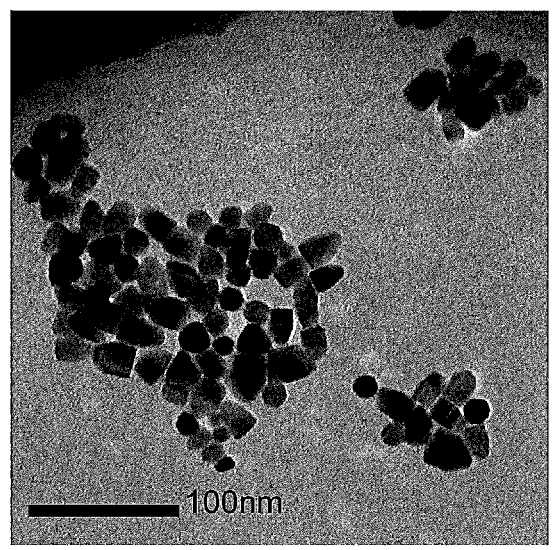
FIG. 2D is a TEM image of a powder for a thermoelectric material according to Example 5.

As shown in FIG. 1B, a thermoelectric conversion device 2 includes, for example, a plurality of first thermoelectric materials 50 and conductors 60 connecting the first thermoelectric materials 50 adjacent to each other. For example, the plurality of first thermoelectric materials 50 are serially connected by the conductors 60. The first thermoelectric materials 50 are each the thermoelectric material according to the first embodiment or second embodiment. As shown in FIG. 1B, the conductors 60 are disposed, for example, on a substrate 70a and substrate 70b. Both the substrate 70a and substrate 70b are, for example, ceramic substrates having a high thermal conductivity.

<Method for Producing Thermoelectric Material>

The thermoelectric materials according to the first embodiment and second embodiment of the present invention can be produced, for example, by forming a particular powder for a thermoelectric material into a predetermined shape and sintering the resultant formed body. In this manner, a thermoelectric material can be produced in various shapes. Examples of the shape of the thermoelectric materials according to the first embodiment and second embodiment of the present invention include cuboids, plates such as flat plates and circular plates, pillars such as circular pillars and prisms, and tubes such as circular tubes and polygonal tubes. The powder for a thermoelectric material has, for example, the following features: (i) the powder includes copper, tin, and sulfur; (ii) a ratio A/B of the number A of copper atoms to the number B of tin atoms is 0.5 to 2.5 and a content of a metal element other than copper and tin is 5 mol % or less with respect to total metal elements; and (iii) the powder includes particles having a particle diameter of 100 nm or less in an amount of 80% or more on a number basis. The use of such a powder for a thermoelectric material allows production of a thermoelectric material having the desired thermal conductivity or lattice thermal conductivity. In particular, when the powder for a thermoelectric material has particles having a uniform size of 100 nm or less in diameter as defined above in (iii), the formed body of the powder for a thermoelectric material can be uniformly sintered. Additionally, the temperature of sintering the formed body of the powder for a thermoelectric material can be decreased. Thus, a thermoelectric material having the desired thermal conductivity or lattice thermal conductivity can be produced. Having thermoelectric conversion properties, the powder for a thermoelectric material itself can be said to be a thermoelectric material. It is difficult to measure the thermal conductivity of the powder for a thermoelectric material itself. Therefore, when a thermoelectric material is produced by forming the powder for a thermoelectric material into the predetermined shape and sintering the resultant formed body, the thermal conductivity of the thermoelectric material refers to the thermal conductivity of the resultant sintered body.

As for the feature (iii) described above, the number-based particle size distribution of the powder for a thermoelectric material can be determined by observing the powder for a thermoelectric material with a transmission electron microscope (TEM) and measuring the particle diameter of 250 or more powder particles. The particle diameter of each powder particle refers to its maximum diameter (also called a "major axis length").

As for the feature (iii) described above, the powder for a thermoelectric material includes particles having a particle diameter of 100 nm or less desirably in an amount of 90% or more, more desirably 95% or more, on a number basis. The powder for a thermoelectric material includes particles having a particle diameter of 80 nm or less in an amount of, for example, 80% or more, desirably 90% or more, even more desirably 95% or more, on a number basis. The powder for a thermoelectric material includes particles having a particle diameter of 60 nm or less in an amount of, for example, 80% or more, desirably 90% or more, even more desirably 95% or more, on a number basis. The powder for a thermoelectric material includes particles having a particle diameter of 10 nm to 50 nm in an amount of, for example, 80% or more, desirably 90% or more, even more desirably 95% or more, on a number basis.

When the thermoelectric materials according to the first embodiment and second embodiment are produced by forming the above-defined powder for a thermoelectric material into a predetermined shape and sintering the resultant formed body, the density of the resultant sintered body is, for example, 80% or more of the theoretical density. The theoretical density is a density determined by assuming that the materials are composed of a single crystal. The density of the sintered body is desirably 85% or more, and more desirably 90% or more of the theoretical density. When the density of the sintered body is 80% or more of the theoretical density, the mechanical strength of the sintered body is high and the electrical conductivity of the sintered body is likely to increase. Therefore, the resultant thermoelectric material is suited for practical use.

An exemplary method for producing the thermoelectric materials according to the first embodiment and second embodiment of the present invention will be described. First, a copper compound, a tin compound, and a sulfur compound or a simple substance of sulfur are added to water under stirring to prepare a liquid mixture so that a ratio A/B of the number A of copper atoms to the number B of tin atoms is 0.5 to 2.5. Next, the liquid mixture is placed in an environment having a temperature of 150 to 300° C. and a pressure of 0.5 to 9 MPa (megapascal) for a predetermined period of time to carry out hydrothermal synthesis. A thermoelectric material according to the present invention can be produced in this manner. That is, according to this production method, a thermoelectric material having a thermal conductivity less than 1.0 W/(m·K) at 200 to 400° C. can be produced without including such metal elements as antimony, vanadium, and indium. A thermoelectric material having a lattice thermal conductivity less than 0.8 W/(m·K) at 80 to 200° C. can also be produced.

Examples of the copper compound in the above production method include chlorides such as CuCl and $CuCl_2$, copper nitrates such as $Cu(NO_3)_2$, and copper acetates such as $Cu(CH_3COO)$ and $Cu(CH_3COO)_2$. Examples of the tin compound in the above production method include chlorides such as $SnCl_2$ and $SnCl_4$, tin nitrate, and tin acetate. Examples of the sulfur compound in the above production method include organic sulfur compounds such as thiourea and thioacetamide. Additionally, when the thermoelectric material includes a metal element other than copper and tin, a compound such as a chloride, nitric acid salt, or acetic acid salt of the metal element can be used as a supply source of the metal element. The preparation of the liquid mixture is carried out, for example, in an environment having ordinary temperature (20° C.±15° C.: Japanese Industrial Standards (JIS) Z 8703) and ordinary pressure.

The temperature of the environment where the hydrothermal synthesis in the above production method is carried out is desirably 170 to 280° C., and more desirably 180 to 250° C. The pressure of the environment is desirably 0.8 to 7.5 MPa, and more desirably 1 to 5 MPa.

In the above production method, the period of time in which the environment having a temperature of 150 to 300° C. and pressure of 0.5 to 9 MPa is maintained is, for example, 4 hours to 100 hours.

Another exemplary method for producing the thermoelectric materials according to the first embodiment and second embodiment of the present invention will be described. First, a liquid mixture containing a copper compound, a tin compound, and a sulfur compound and/or a simple substance of sulfur in an organic solvent is prepared so that a ratio A/B of the number A of copper atoms to the number B of tin atoms is 0.5 to 2.5. Next, the liquid mixture is placed in an environment filled with an inert gas and having a temperature of 150 to 350° C. for a predetermined period of time to carry out synthesis of a thermoelectric material. A thermoelectric material according to the present invention can also be produced in this manner. That is, according to this production method, a thermoelectric material having a thermal conductivity less than 1.0 W/(m·K) at 200 to 400° C. can be produced without including such metal elements as antimony, vanadium, and indium. A thermoelectric material having a lattice thermal conductivity less than 0.8 W/(m·K) at 80 to 200° C. can also be produced.

In this production method, the compounds mentioned as examples in the above production method involving hydrothermal synthesis can be used as the copper compound and tin compound. A complex compound, such as copper acetylacetonate or tin acetylacetonate, soluble in the organic solvent can also be used as the copper compound and tin compound. When the sulfur compound is included in the liquid mixture, examples of the sulfur compound include organic sulfur compounds such as: (i) thiols such as octanethiol, decanethiol, and dodecanethiol; (ii) dithiols such as octanedithiol, decandithiol, and dodecanedithiol; (iii) thiourea; and (iv) thioacetamide. The organic sulfur compound is desirably a liquid organic sulfur compound such as a thiol. In this case, the liquid organic sulfur compound can serve as the organic solvent in the liquid mixture. The liquid mixture may contain a liquid organic compound other than the liquid organic sulfur compound. Examples of such a liquid organic compound include: (i) amines such as oleylamine; (ii) unsaturated fatty acids such as myristoleic acid, palmitoleic acid, and oleic acid; and (iii) polyhydric alcohols such as ethylene glycol, triethylene glycol, and tetraethylene glycol. Additionally, when the thermoelectric material includes a metal element other than copper and tin, the compounds mentioned as examples in the above production method involving hydrothermal synthesis can be used as a supply source of the metal element. A metal complex compound, such as acetylacetonate, soluble in the organic solvent can also be used. The preparation of the liquid mixture is carried out, for example, in an environment having ordinary temperature and ordinary pressure.

The inert gas used in this production method is not particularly limited as long as the inert gas is inert to the liquid mixture. The inert gas is, for example, a noble gas such as argon or nitrogen. The pressure of the environment where the liquid mixture is placed is desirably ordinary pressure.

In this production method, the period of time in which the environment filled with the inert gas and having a temperature of 150 to 350° C. is maintained is, for example, about 2 hours at most.

The thermoelectric material produced according to either of the production methods described above is sintered as necessary. Impurities derived from the production process are sometimes attached to the surface of the synthesized thermoelectric material. If necessary, the impurities are removed from the thermoelectric material before the sintering process by a known method such as replacement of a surface treatment agent, washing, or pre-heating. In particular, when the boiling point of the surface treatment agent is high, when the surface treatment agent is hardly decomposable, or when the surface treatment agent has a long carbon chain, the production of a sintered body may leave impurities and thus interstices may be formed between particles. Therefore, the surface treatment agent is preferably replaced in advance by a surface treatment agent having a short alkyl chain, having a low boiling point, or easily decomposable. Specifically, the surface treatment agent may be replaced by a surface treatment agent vaporizable or decomposable at a temperature equal to or lower than the sintering temperature. For example, in the case of the present material system, the surface treatment agent is preferably replaced by a surface treatment agent vaporizable or decomposable at 300° C. or less, and preferably replaced by a surface treatment agent vaporizable or decomposable at 250° C. or less. The number of carbon atoms included per molecule in the replacing surface treatment agent is preferably 10 or less, more preferably 5 or less, and even more preferably 3 or less.

The thermoelectric material is, for example, filled in a mold having a predetermined shape and then sintered under pressure. An example of the method that can be used to accomplish such sintering of the thermoelectric material under pressure is spark plasma sintering. The temperature of sintering the thermoelectric material is, for example, 150 to 1500° C., and desirably 200 to 1000° C. The sintering time is, for example, 0 minutes to 10 minutes, and desirably 0 minutes to 5 minutes. The required heat-up time from the start of the sintering process to arrival at the highest temperature in the sintering process is, for example, 2 minutes to 10 minutes. For example, the internal temperature of the mold filled with the thermoelectric material is increased to the highest temperature at the above heat-up rate and maintained at the highest temperature for the predetermined time (sintering time), after which the heating is stopped and the sintered body is left to cool. In the sintering process, the pressure applied to the synthesized thermoelectric material is, for example, 0.5 MPa to 100 MPa, and desirably 5 MPa to 50 MPa. When a large pellet should be obtained or when the mechanical strength of a pellet needs to be increased, the sintering time or heat-up time is preferably extended to obtain a uniform sintered body. This sintering process can be carried out in an inert gas atmosphere or vacuum atmosphere. This sintering process is preferably carried out in a vacuum atmosphere. In this manner, the thermoelectric material can be formed into a desired shape with increased mechanical strength, and, at the same time, the sintering can be accomplished while grains of nanoparticles are left.

Third Embodiment

Sulfide particles according to a third embodiment of the present invention include copper, a Group 14 element which is germanium and/or tin, and a Group 5 metal element. The sulfide particles have a particle diameter of 1 nm to 100 nm. The particle diameter of the sulfide particles can be determined, for example, by directly observing the sulfide particles with a transmission electron microscope (TEM) or scanning electron microscope (SEM). In this case, the direction in which the particle diameter of each individual sulfide particle is determined is a direction in which the particle diameter of the sulfide particle is the largest in an obtained TEM image or SEM image of the sulfide particles. That is, the particle diameter of each powder particle refers to its maximum diameter (also called a "major axis length").

The particle diameter of the sulfide particles is typically 2 nm to 50 nm and, in some cases, 3 nm to 30 nm.

The sulfide particles according to the third embodiment have, for example, a wurtzite structure. The crystal structure of the sulfide particles can be determined, for example, by obtaining an X-ray diffraction pattern of the sulfide particles. In this case, for example, CuKα radiation is used as the X-ray.

The Group 5 metal element included in the sulfide particles is, for example, vanadium. In this case, sulfide particles having a particle diameter of 1 nm to 100 nm and including all the metals concerned are likely to be obtained.

For example, the number of atoms of the Group 5 metal element included in the sulfide particles accounts for 1 to 5% of the sum of the numbers of atoms of the copper, Group 14 element, and Group 5 metal element included in the sulfide particles. The number of atoms of the Group 5 metal element included in the sulfide particles desirably accounts for 1 to 4%, more desirably 2 to 4%, of the sum of the numbers of atoms of the copper, Group 14 element, and Group 5 metal element included in the sulfide particles.

The crystal structure of the sulfide particles may include an element other than copper, the Group 14 element, Group 5 metal element, and sulfur. It is desirable that the crystal structure of the sulfide particles only include copper, the Group 14 element, Group 5 metal element, and sulfur.

A sulfide of the present invention includes copper, germanium and/or tin, and the Group 5 metal element and has a wurtzite structure.

A semiconductor material according to the third embodiment of the present invention includes the above sulfide particles and above sulfide as constituent materials.

A thermoelectric material according to the third embodiment of the present invention includes a sintered body including the above sulfide particles and above sulfide as constituent materials.

The above sintered body has, for example, a zinc blende structure.

An exemplary method for producing the above sulfide particles will be described. First, a copper compound (A), compound (B) including a Group 14 element which is germanium and/or tin, and compound (C) including a Group 5 metal element are added to a liquid containing sulfur or a sulfur compound in an inert gas atmosphere. Then, the copper compound (A), compound (B), compound (C), and sulfur or sulfur compound are reacted to cause deposition of sulfide particles including the copper, Group 14 element which is germanium and/or tin, and Group 5 metal element and having a particle diameter of 1 nm to 100 nm. This is followed by separation of the sulfide particles deposited in the liquid from the liquid. The above sulfide particles can be produced in this manner.

In the above production method, the number (Nv) of atoms of the Group 5 metal element included in the compound (C) is, for example, 0.5 to 3 times larger than the number (Ns) of atoms of the Group 14 element included in the compound (B). The Nv is desirably 0.7 to 3 times larger than the Ns. This makes it easy to obtain sulfide particles having a particle diameter of 1 nm to 100 nm.

In the above production method, a product obtained by reacting the copper compound (A), compound (B), compound (C), and sulfur or sulfur compound may be brought into contact with a liquid amine. This allows proper washing of the sulfide particles included in the product. Examples of the liquid amine include oleylamine, dodecylamine, hexamethylenediamine, and triethylenetetramine. With such a liquid amine, sulfide particles having uniform particle diameters are likely to be obtained. The term "uniform particle diameters" means that particles having a particle diameter of 0.5 to 2 times larger than the mean particle diameter account for 70% or more, desirably 80% or more, more desirably 90% or more, of the total particles on a number basis.

In the above production method, examples of the copper compound (A) include chlorides such as CuCl and $CuCl_2$, copper nitrates such as $Cu(NO_3)_2$, acetylacetone complexes such as copper(II) acetylacetonate, and copper acetates such as $Cu(CH_3COO)$ and $Cu(CH_3COO)_2$.

In the above production method, examples of the compound (B) include chlorides, nitric acid salts, acetylacetone complexes, and acetic acid salts of the Group 14 element. When the Group 14 element is tin, examples of the compound (B) include chlorides such as $SnCl_2$ and $SnCl_4$, tin nitrate, tin acetylacetonate, tin(IV) acetylacetonate dichloride, or tin(II) acetate.

In the above production method, examples of the compound (C) include carboxylic acid salts, halides, acetylacetone complexes, and carbonyl complexes of the Group 5 metal element. When the Group 5 metal element is vanadium, examples of the compound (C) include tris(acetylacetonato)vanadium(III), vanadium(III) chloride, vanadium (III) naphthenate, vanadium(IV) tetraacetate, and hexacarbonylvanadium.

In the above production method, examples of the inert gas include noble gases such as argon and nitrogen.

In the above production method, examples of the sulfur compound include organic sulfur compounds such as: (i) thiols such as octanethiol, decanethiol, and dodecanethiol; (ii) dithiols such as octanedithiol, decandithiol, and dodecanedithiol; (iii) thiourea; and (iv) thioacetamide. The sulfur compound is desirably a liquid organic sulfur compound such as a thiol.

In the above production method, the liquid containing sulfur or the sulfur compound may include an organic compound other than the liquid organic sulfur compound. Examples of such an organic compound include: (i) amines such as oleylamine; (ii) unsaturated fatty acids such as myristoleic acid, palmitoleic acid, and oleic acid; (iii) polyhydric alcohols such as ethylene glycol, triethylene glycol, and tetraethylene glycol; (iv) ethers such as dioctylether and phenylether; and (v) alkenes such as octadecene.

In the above production method, the sulfide particles deposited in the liquid are separated from the liquid by a known solid-liquid separation method such as filtration, decantation, or centrifugation.

After the separation from the liquid, the sulfide particles are washed as necessary. In this case, for example, the sulfide particles are dispersed in a predetermined solvent and subjected to ultrasonic cleaning. If necessary, the sulfide particles having been washed may be subjected to a known drying process such as vacuum drying, heat drying, or natural drying.

The sulfide particles produced according to the above production method are sintered as necessary. Impurities derived from the production process are sometimes attached to the surface of the synthesized sulfide particles. If necessary, the impurities are removed from the sulfide particles before the sintering process by a known method such as washing or pre-heating.

The sulfide particles are, for example, filled in a mold having a predetermined shape and then sintered under pressure. An example of the method that can be used to accomplish such sintering of the sulfide particles under pressure is spark plasma sintering. The temperature of sintering the sulfide particles is, for example, 150 to 1500° C., and desirably 200 to 1000° C. When a small pellet having a diameter of about 10 mm is obtained, the sintering time is, for example, 0 minutes to 10 minutes, and desirably 0 minutes to 5 minutes. The required heat-up time from the start of the sintering process to arrival at the highest temperature in the sintering process is, for example, 2 minutes to 10 minutes. When a large pellet should be obtained or when the mechanical strength of a pellet needs to be increased, the sintering time or heat-up time is preferably extended to obtain a uniform sintered body. For example, the internal temperature of the mold filled with the sulfide particles is increased to the highest temperature at the above heat-up rate and maintained at the highest temperature for the predetermined time (sintering time), after which the heating is stopped and the sintered body is left to cool. In the sintering process, the pressure applied to the synthesized thermoelectric material is, for example, 0.5 MPa to 100 MPa, and desirably 5 MPa to 50 MPa. This sintering process can be carried out in an inert gas atmosphere or vacuum atmosphere. This sintering process is preferably carried out in a vacuum atmosphere. In this manner, the sintered body of the sulfide particles can be obtained in a desired shape and the mechanical strength can be increased.

EXAMPLES

Hereinafter, the present invention will be described in more detail with reference to Examples. It should be noted that Examples given below are only illustrative instances of the present invention. The present invention is not limited to Examples given below.

Example 1

An amount of 33.3 mmol (millimole) of $CuCl_2$, 16.6 mmol of $SnCl_4$, 150 mmol of thiourea, and 100 ml (milliliter) of water were mixed and stirred to obtain a liquid mixture A in which the $CuCl_2$, $SnCl_4$, and thiourea were uniformly dissolved. Next, the liquid mixture A was placed in a reaction vessel having a volume of 200 ml and lying in a hydrothermal synthesis reactor manufactured by HIRO COMPANY to carry out hydrothermal synthesis in an environment having a pressure of 1.5 MPa and temperature of 190° C. for 72 hours. Subsequently, a black powder as a thermoelectric material according to Example 1 (a powder for a thermoelectric material according to Example 1) was taken out from the reaction vessel. Next, 750 mg of the black powder was filled in a die having a diameter of 10 mm and subjected to sintering under vacuum at a pressure of 40 MPa using a spark plasma sintering apparatus (manufactured by SINTER LAND Incorporation, Ltd, product code: LABOX-125). Through electric heating by the spark plasma sintering apparatus, the internal temperature of the die was increased to 450° C. at a heat-up rate of 100° C./minute. Subsequently, the internal temperature of the die was increased to 500° C. at a heat-up rate of 50° C./minute and maintained at 500° C. for 2 minutes. Subsequently, the electric heating by the spark plasma sintering apparatus was stopped and the resultant sintered body was left to cool to room temperature. The sintered body in a disk shape was then taken out from the die. Next, both sides of the sintered body were ground using a rotating grinder (manufactured by Maruto Instrument Co., Ltd., product name: ML-160A, grit based on JIS R 6001 (1998): #2000) to prepare a sample according to Example 1 with a thickness of about 2 mm. The metal element composition of the sample according to Example 1 was examined using a fluorescent X-ray analyzer (manufactured by Rigaku Corporation, product name: ZSX Primus II). According to the examination result, the sample according to Example 1 included 67 mol % of Cu and 33 mol % of Sn as metal elements. The density of the obtained sintered body was 94% of the theoretical density.

Example 2

An amount of 0.2 mmol of copper nitrate, 0.1 mmol of tin acetate, 10 ml of dodecanethiol, and 10 ml of oleylamine were mixed and stirred to obtain a liquid mixture B in which the copper nitrate and tin acetate were uniformly dispersed. Next, in a space filled with argon gas was placed a container holding the liquid mixture B, which was heated to 260° C. under stirring for 1 hour. A thermoelectric material according to Example 2 in the form of a powder was thus synthesized in the container. Subsequently, the powder as the thermoelectric material according to Example 2 (a powder for a thermoelectric material according to Example 2) was taken out of the container. After several repetitions of the synthesis, the powder was sintered using a spark plasma sintering apparatus in the same manner as in Example 1, and the resultant sintered body was ground by a rotating grinder in the same manner as in Example 1. In this manner, a sample according to Example 2 with a thickness of about 2 mm was prepared. The metal element composition of the sample according to Example 2 was examined using a high-frequency inductively coupled plasma-optical emission spectrometer (ICP-OES) (manufactured by Shimadzu Corporation, product name: ICPS-7000). According to the examination result, the sample according to Example 2 included 67 mol % of Cu and 33 mol % of Sn as metal elements. The density of the obtained sintered body was 94% of the theoretical density.

Example 3

An amount of 4.0 mmol of copper nitrate, 1.8 mmol of tin acetate, 0.2 mmol of zinc acetate, 100 ml of dodecanethiol, and 100 ml of oleylamine were mixed and stirred to obtain a liquid mixture C in which the copper nitrate and tin acetate were uniformly dispersed. Next, in a space filled with argon gas was placed a container holding the liquid mixture C, which was heated to 260° C. under stirring for 1 hour. A liquid in which particles were deposited was thus obtained. Methanol was added to the thus obtained liquid, which was centrifuged at 5000 rpm for 5 minutes, and the resultant precipitate was collected. The collected precipitate was washed with hexane and methanol. This was followed by dispersing the obtained precipitate in 50 ml of toluene. The resultant dispersion was mixed with a solution containing 2.5 g of thiourea dissolved in methanol. The resultant liquid mixture was ultrasonicated to replace a surface treatment agent. Subsequently, the resultant solid was washed with hexane, methanol, and toluene and then vacuum-dried using a vacuum dryer. In this manner, a powder for a thermoelectric material according to Example 3 was obtained. After several repetitions of the synthesis, the powder for a thermoelectric material according to Example 3 was sintered using a spark plasma sintering apparatus in the same manner as in Example 1, and the resultant sintered body was ground by a rotating grinder in the same manner as in Example 1. In this manner, a sample according to Example 3 with a thickness of about 2 mm was prepared. The metal element composition of the sample according to Example 3 was examined using an ICP-OES (manufactured by Shimadzu Corporation, product name: ICPS-7000). According to the examination result, the sample according to Example 3 included 65 mol % of Cu, 31 mol % of Sn, and 4 mol % of Zn as metal elements. The density of the obtained sintered body was 97% of the theoretical density.

Example 4

A powder for a thermoelectric material according to Example 4 was obtained in the same manner as in Example 3, except for using 0.2 mmol of iron(II) acetate instead of zinc acetate. The powder for a thermoelectric material according to Example 4 was sintered using a spark plasma sintering apparatus in the same manner as in Example 1, and the resultant sintered body was ground by a rotating grinder in the same manner as in Example 1. In this manner, a sample according to Example 4 with a thickness of about 2 mm was prepared. The metal element composition of the sample according to Example 4 was examined using an ICP-OES (manufactured by Shimadzu Corporation, product name: ICPS-7000). According to the examination result, the sample according to Example 4 included 66 mol % of Cu, 30 mol % of Sn, and 4 mol % of Fe as metal elements. The density of the obtained sintered body was 97% of the theoretical density.

Example 5

A powder for a thermoelectric material according to Example 5 was obtained in the same manner as in Example 3, except for using 0.2 mmol of cobalt acetylacetonate instead of zinc acetate and ethanol instead of methanol as a washing solvent. The powder for a thermoelectric material according to Example 5 was sintered using a spark plasma sintering apparatus in the same manner as in Example 1, and the resultant sintered body was ground by a rotating grinder in the same manner as in Example 1. In this manner, a sample according to Example 5 with a thickness of about 2 mm was prepared. The metal element composition of the sample according to Example 5 was examined using an ICP-OES (manufactured by Shimadzu Corporation, product name: ICPS-7000). According to the examination result, the sample according to Example 5 included 61 mol % of Cu, 35 mol % of Sn, and 4 mol % of Co as metal elements. The density of the obtained sintered body was 94% of the theoretical density.

Comparative Example

In a planetary ball mill manufactured by Retsch GmbH were placed 1.11 g of a copper powder, 1.04 g of a tin powder, and 0.84 g of a sulfur powder, which were subjected to repeated cycles of 9-minute rotation at 300 rpm (revolutions per minute) and 1-minute interval for 3 hours to obtain a powder. The obtained powder was sintered using a spark plasma sintering apparatus in the same manner as in Example 1, and the resultant sintered body was ground by a rotating grinder in the same manner as in Example 1. In this manner, a sample according to Comparative Example with a thickness of about 2 mm was prepared. The density of the obtained sintered body was 93% of the theoretical density.

<Measurement of Thermal Conductivity>

The thermal conductivity of the sample according to Example 1 was measured at 20° C., 101° C., 201° C., 300° C., and 400° C. The thermal conductivity of the sample according to Example 2 was measured at 20° C., 98° C., 195° C., 296° C., and 396° C. The thermal conductivity of the sample according to Example 3 was measured at 75° C., 125° C., 175° C., 225° C., 275° C., 325° C., and 375° C. The thermal conductivity of the sample according to Example 4 was measured at 78° C., 125° C., 174° C., 223° C., 271° C., 321° C., and 369° C. The thermal conductivity of the sample according to Example 5 was measured at 101° C., 148° C., 197° C., 245° C., 294° C., 344° C., and 392° C. The thermal conductivity of the sample according to Comparative Example was measured at 20° C., 101° C., 201° C., 300° C., and 400° C. A laser flash thermophysical property measurement apparatus (manufactured by Kyoto Electronics Manufacturing Co., Ltd., product name: LFA-502) was used for the thermal conductivity measurement. The results are shown in Table 1. As shown in Table 1, the samples according to Examples 1 and 2 had a thermal conductivity less than 1.0 W/(m·K) at 200 to 400° C. The samples according to Examples 3 to 5 had a thermal conductivity less than 1.0 W/(m·K) at 200 to 400° C. In contrast, the sample according to Comparative Example had a thermal conductivity over 1.0 W/(m·K) at 200 to 400° C.

<Measurement of Electrical Conductivity>

The electrical conductivity $\sigma$ of the samples according to Examples 1 to 5 and Comparative Example was measured at the temperatures at which the thermal conductivity was measured. The electrical conductivity $\sigma$ of the samples according to Examples 1 to 5 and Comparative Example was measured using a thermoelectric property evaluator manufactured by OZAWA SCIENCE CO., LTD. (product name: RZ2001i) or ULVAC-RIKO, Inc. (product name: ZEM-3). Before the measurement, the samples were subjected to a pretreatment to increase the temperature of the samples to 400° C. in case where impurities were attached to the surfaces of the samples.

<Determination of Carrier Thermal Conductivity and Lattice Thermal Conductivity>

From the results of the measurement of the electrical conductivity $\sigma$ of the samples according to Examples 1 to 5 and Comparative Example, the carrier thermal conductivity $\kappa$car at the temperatures at which the thermal conductivity of the samples according to Examples 1 to 5 and Comparative Example was measured was calculated using the Wiedemann-Franz equation shown below. In the equation, L represents the Lorentz number: $2.44 \times 10^{-8}$ W$\Omega^2$K$^{-2}$. The lattice thermal conductivity $\kappa$lat at the temperatures at which the thermal conductivity of the samples according to Examples 1 to 5 and Comparative Example was measured was determined by subtracting the carrier thermal conductivity $\kappa$car from the thermal conductivity. The results are shown in Table 1.

$$\kappa\text{car} = L\sigma T$$

Table 1 confirms that the samples according to Examples 1 to 5 had a lattice thermal conductivity less than 0.8 W/(m·K) at 80 to 200° C. The sample according to Comparative Example had a lattice thermal conductivity of 0.8 or more at 101° C., for example.

<Measurement of Particle Size Distribution of Powder for Thermoelectric Material>

The powders for a thermoelectric material according to Examples 2 to 5 were observed using a transmission electron microscope (TEM) (manufactured by Hitachi High-Technologies Corporation, product name: H-7100 or H-7650). TEM images of the powders for a thermoelectric material according to Examples 2 to 5 are respectively shown in FIGS. 2A, 2B, 2C, and 2D. From the obtained TEM images of the powders for a thermoelectric material according to Examples 2 to 5, the number-based particle size distribution of 250 or more powder particles and mean particle diameter thereof were determined. The maximum diameter (major axis length) of each powder particle was defined as the particle diameter. The results are shown in Table 2.

<Observation of Crystal Grain Boundaries>

Figure 3:
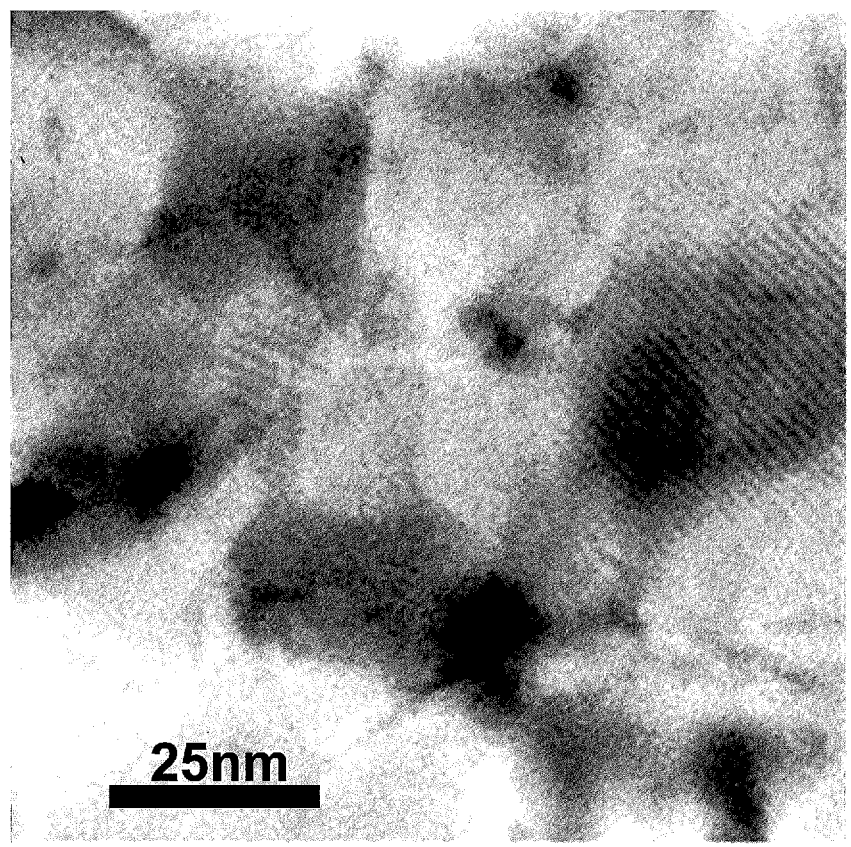
FIG. 3 is a high-angle annular dark-field scanning transmission electron microscopy (HAADF-STEM) image of a sample according to Example 2.

Crystal grain boundaries of the sample according to Example 2 were observed by HAADF-STEM. A HAADF-STEM image of the sample according to Example 2 is shown in FIG. 3. As seen from FIG. 3, the sample according to Example 2 had a crystal grain size of 100 nm or less.

<X-Ray Diffraction>

Figure 4A:
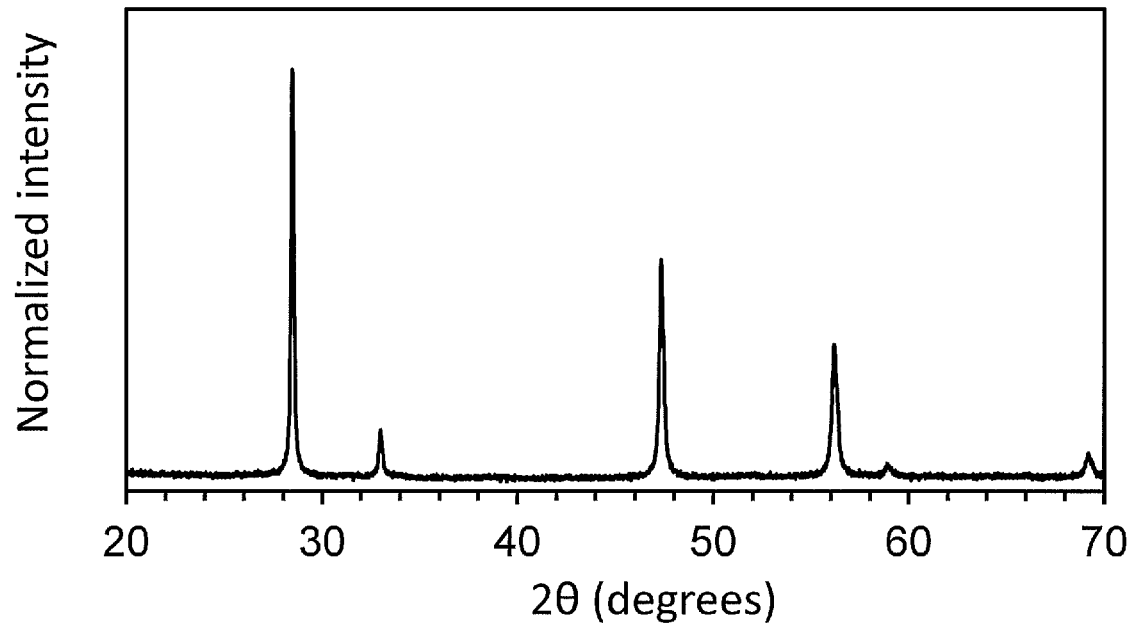
FIG. 4A is a graph showing an X-ray diffraction pattern of a sample according to Example 1.
Figure 4B:
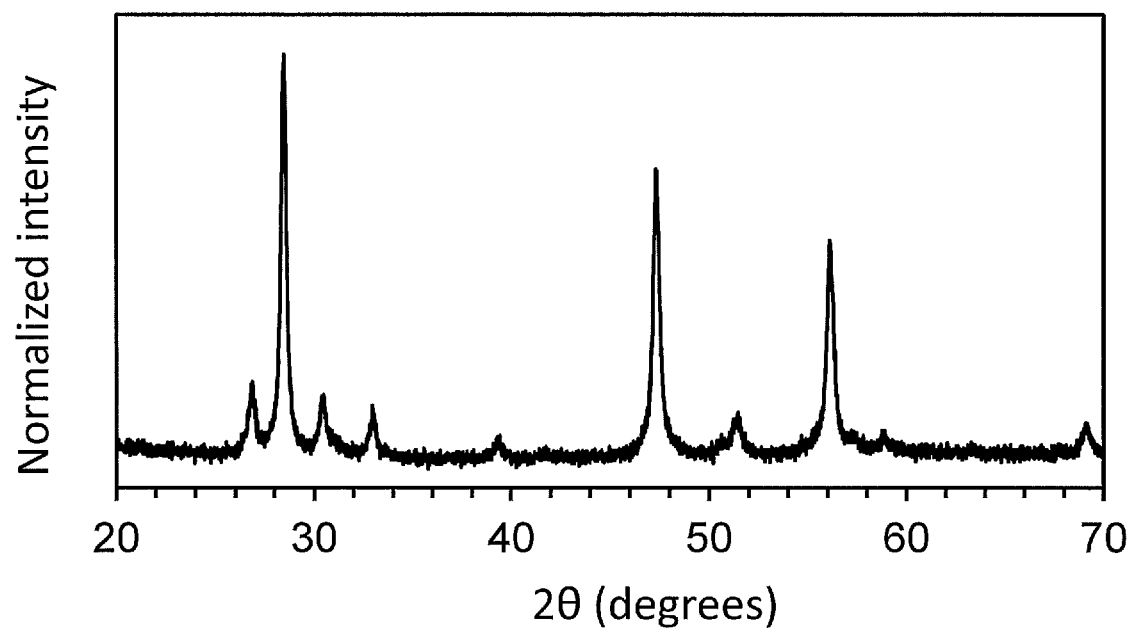
FIG. 4B is a graph showing an X-ray diffraction pattern of the sample according to Example 2.
Figure 5A:
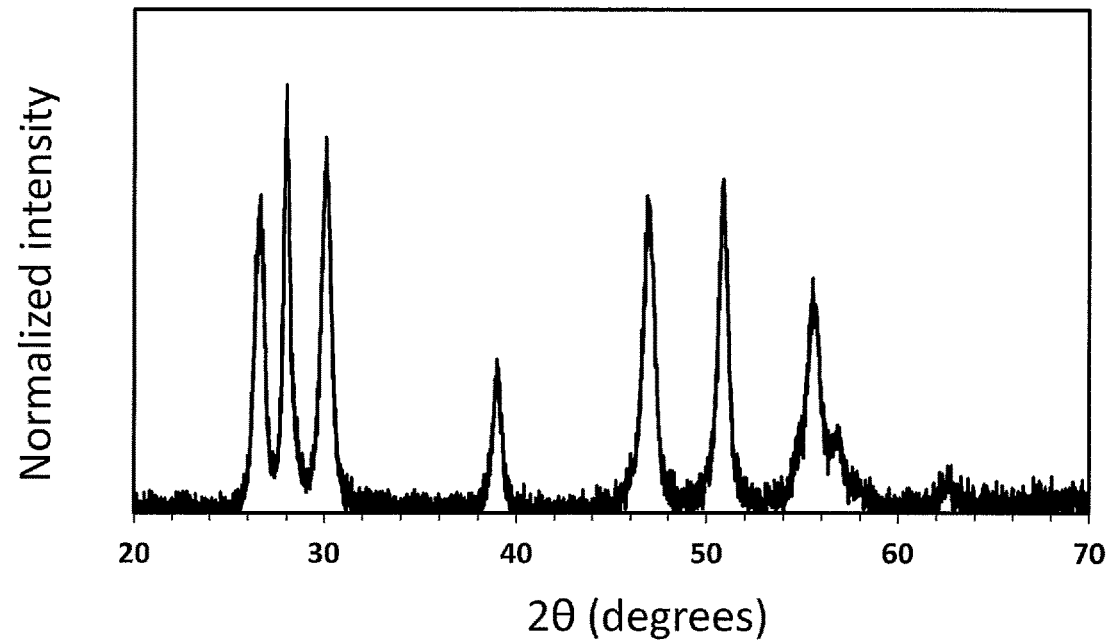
FIG. 5A is a graph showing an X-ray diffraction pattern of the powder for a thermoelectric material according to Example 2.
Figure 5B:
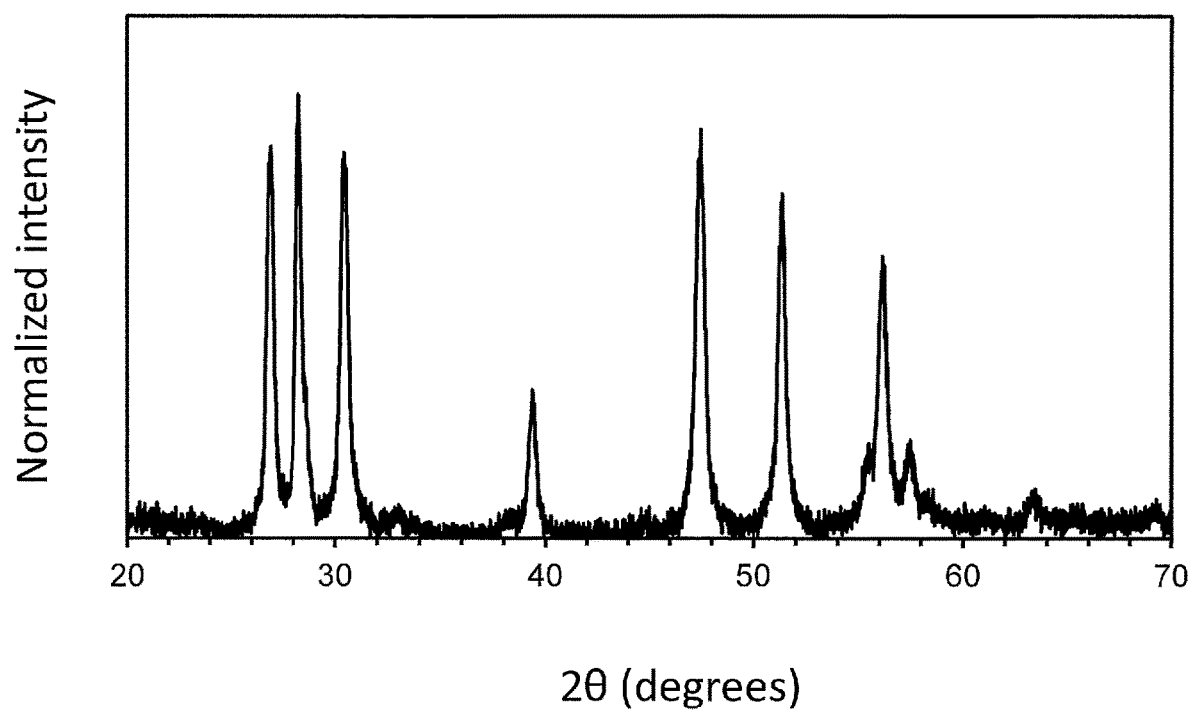
FIG. 5B is a graph showing an X-ray diffraction pattern of the powder for a thermoelectric material according to Example 3.
Figure 5C:
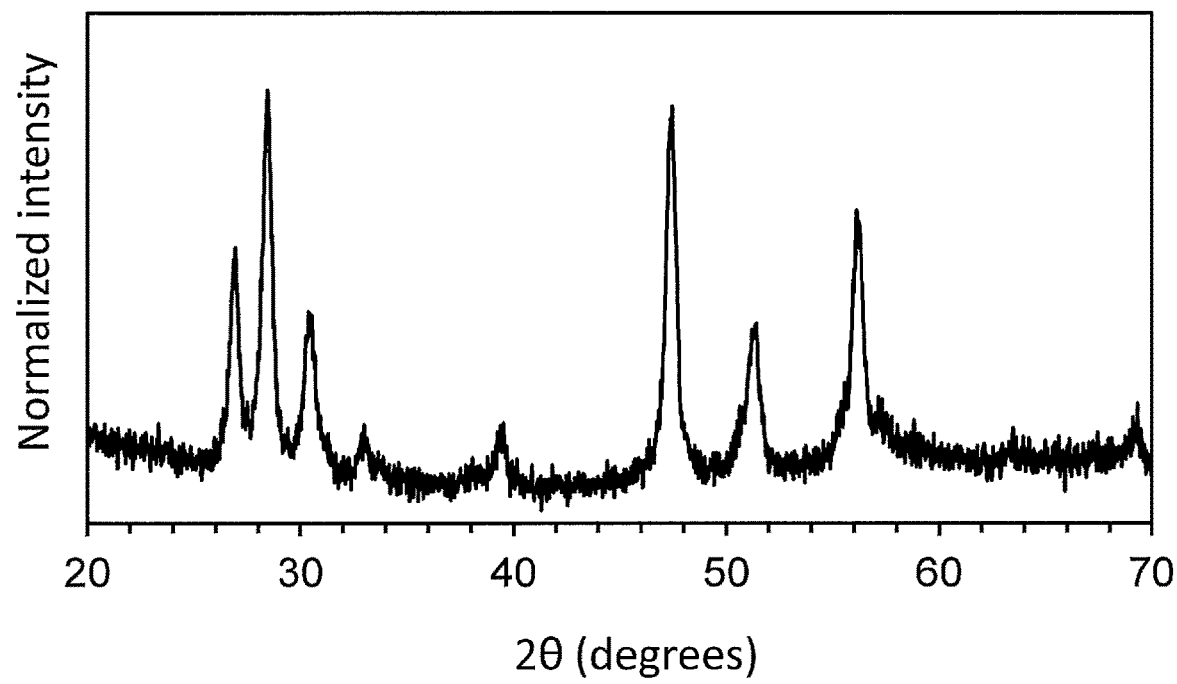
FIG. 5C is a graph showing an X-ray diffraction pattern of the powder for a thermoelectric material according to Example 4.
Figure 5D:
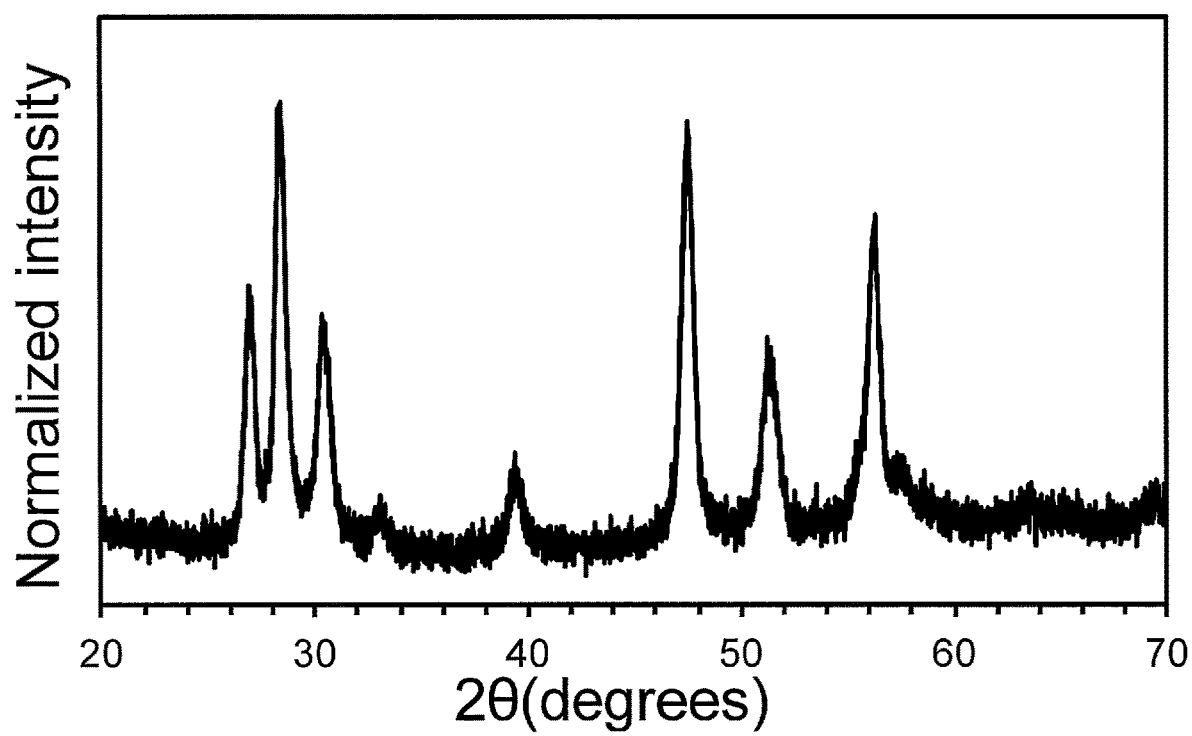
FIG. 5D is a graph showing an X-ray diffraction pattern of the powder for a thermoelectric material according to Example 5.

X-ray diffraction patterns of the samples according to Examples 1 and 2 were obtained using an X-ray diffractometer (manufactured by Rigaku Corporation, product name: MiniFlex 600). CuKα radiation was used as the X-ray. The X-ray diffraction patterns of the samples according to Examples 1 and 2 are respectively shown in FIGS. 4A and 4B. It was confirmed that the samples according to Examples 1 and 2 had a zinc blende structure as their main crystal structures. X-ray diffraction patterns of the powders for a thermoelectric material according to Examples 2 to 5 were obtained using an X-ray diffractometer (manufactured by Rigaku Corporation, product name: MiniFlex 600). CuKα radiation was used as the X-ray. X-ray diffraction patterns of the powders for a thermoelectric material according to Examples 2 to 5 are respectively shown in FIGS. 5A, 5B, 5C, and 5D. It was confirmed that the powders for a thermoelectric material according to Examples 2 to 5 mainly had a wurtzite structure as their main crystal structure.

Synthesis Example 1

In a nitrogen atmosphere, 5.2 mmol (millimole) of $Cu(NO_3)_2$, 2.5 mmol of $Sn(CH_3COO)_2$, and 3.0 mmol of $V(CH_3COCHCOCH_3)_3$ were mixed. Next, 150 ml (milliliter) of oleylamine and 150 ml of dodecanethiol were added to prepare a liquid, and the nitrogen was replaced by argon. After that, in the argon atmosphere, the liquid was stirred at 550 rpm at room temperature for 5 minutes. In the same manner, the liquid was further stirred at 100° C. for 10 minutes and then at 260° C. for 60 minutes, and subsequently cooled down to room temperature. The liquid was divided into 16 centrifuge tubes. The amount of the liquid in each centrifuge tube was a little less than 20 ml. Methanol was added to each centrifuge tube so that the amount of the liquid therein would be 45 ml. Next, the centrifuge tubes were subjected to centrifugation at 5000 rpm for 5 minutes. The resultant supernatants of the liquids in the centrifuge tubes were then removed therefrom. An amount of 1 ml of hexane was added to each centrifuge tube, which was subjected to ultrasonication. The solids precipitated in the centrifuge tubes were thus dispersed in the liquids. Next, the 16 centrifuge tubes were divided into 4 groups each consisting of 4 centrifuge tubes. In each of the 4 groups, the dispersions in the 4 centrifuge tubes were transferred to one centrifuge tube. Thus, 4 centrifuge tubes each containing a dispersion were obtained. Next, 40 ml of methanol was added to each centrifuge tube, which was subjected to centrifugation at 5000 rpm for 5 minutes. The resultant supernatants of the liquids in the centrifuge tubes were then removed therefrom. An amount of 45 ml of hexane was added to each centrifuge tube, which was subjected to ultrasonication. Then, 500 µl of oleylamine was added to each centrifuge tube, which was subjected to ultrasonication for 10 minutes to disperse the solid. Next, the dispersion in each centrifuge tube was divided into 2 centrifuge tubes to obtain 8 centrifuge tubes each containing a dispersion. An amount of 8 ml of ethanol was added to each centrifuge tube, which was subjected to centrifugation at 1000 rpm for 2 minutes. The 8 centrifuge tubes were divided into 4 groups each consisting of 2 centrifuge tubes. In each of the 4 groups, 1 ml of hexane was added to one of the 2 centrifuge tubes, and the centrifuge tube was subjected to ultrasonication to disperse the solid. The dispersion in the centrifuge tube to which 1 ml of hexane had been added was transferred to the other centrifuge tube, which was subjected to ultrasonication to disperse the solid. Thus, 4 centrifuge tubes each containing a dispersion were obtained. Next, 40 ml of methanol was added to each centrifuge tube, which was subjected to ultrasonication to disperse the solid. The centrifuge tubes were subjected to centrifugation at 5000 rpm for 5 minutes. The resultant supernatants were subsequently removed from the centrifuge tubes.

Next, 25 ml of toluene was added to each of the 2 centrifuge tubes, which were subjected to ultrasonication to disperse the solids. A solution containing 2.5 g of thiourea dissolved in 100 ml of methanol and the dispersions in the centrifuge tubes were placed in a flask, which was sealed with Parafilm (registered trademark) and subjected to ultrasonication. The flask was sometimes shaken during the ultrasonication to mix the contents of the flask.

Figure 6:
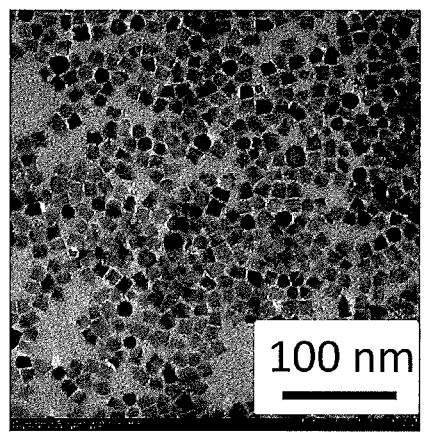
FIG. 6 is a TEM image of sulfide particles according to Synthesis Example 1.

Next, the reaction solution in the flask was divided into 4 centrifuge tubes. The centrifuge tubes were subjected to centrifugation at 5000 rpm for 3 minutes. The resultant supernatants were removed from the centrifuge tubes. This was followed by addition of 10 ml of hexane to each centrifuge tube, which was subjected to ultrasonication to disperse the solid. The centrifuge tubes were then subjected to centrifugation at 5000 rpm for 3 minutes. The resultant supernatants were removed from the centrifuge tubes. An amount of 10 ml of methanol was added to each centrifuge tube, which was subjected to ultrasonication to disperse the solid. This was followed by addition of 10 ml of toluene to each centrifuge tube, which was subjected to ultrasonication to disperse the solid. The centrifuge tubes were then subjected to centrifugation at 5000 rpm for 3 minutes. The resultant supernatants were removed from the centrifuge tubes to obtain 4 centrifuge tubes each containing a solid. Next, 10 ml of hexane was added to a first centrifuge tube, which was subjected to ultrasonication to disperse the solid. The dispersion in the first centrifuge tube was transferred to a second centrifuge tube, which was subjected to ultrasonication to disperse the solid. The dispersion in the second centrifuge tube was transferred to a third centrifuge tube, which was subjected to ultrasonication to disperse the solid. The dispersion in the third centrifuge tube was transferred to a fourth centrifuge tube, which was subjected to ultrasonication to disperse the solid. The dispersion in the fourth centrifuge tube was divided into 2 centrifuge tubes. An amount of 10 ml of methanol was added to each centrifuge tube, which was subjected to ultrasonication to disperse the solid. Then, 10 ml of toluene was added to each centrifuge tube, which was subjected to ultrasonication to disperse the solid. The centrifuge tubes were subjected to centrifugation at 5000 rpm for 3 minutes. The resultant supernatants were removed from the centrifuge tubes. This was followed by drying of the contents of the centrifuge tubes by a vacuum dryer. In this manner, sulfide particles according to Synthesis Example 1 were obtained. The composition of the sulfide particles according to Synthesis Example 1 was analyzed using an ICP-optical emission spectrometer (manufactured by Shimadzu Corporation, product name: ICPS-7000). According to the analysis result, the molar ratio of Cu, Sn, and V to each other in the sulfide particles according to Synthesis Example 1 was Cu:Sn:V=69:28:3. The sulfide particles according to Synthesis Example 1 were observed using a transmission electron microscope (TEM) (manufactured by Hitachi High-Technologies Corporation, product name: H-7100 or H-7650). A TEM image of the sulfide particles according to Synthesis Example 1 is shown in FIG. 6. As shown in FIG. 6, the sulfide particles according to Synthesis Example 1 having a particle diameter of 100 nm or less accounted for 100% on a number basis. Furthermore, the sulfide particles having a particle diameter of 50 nm or less accounted for 100% on a number basis.

Figure 7:
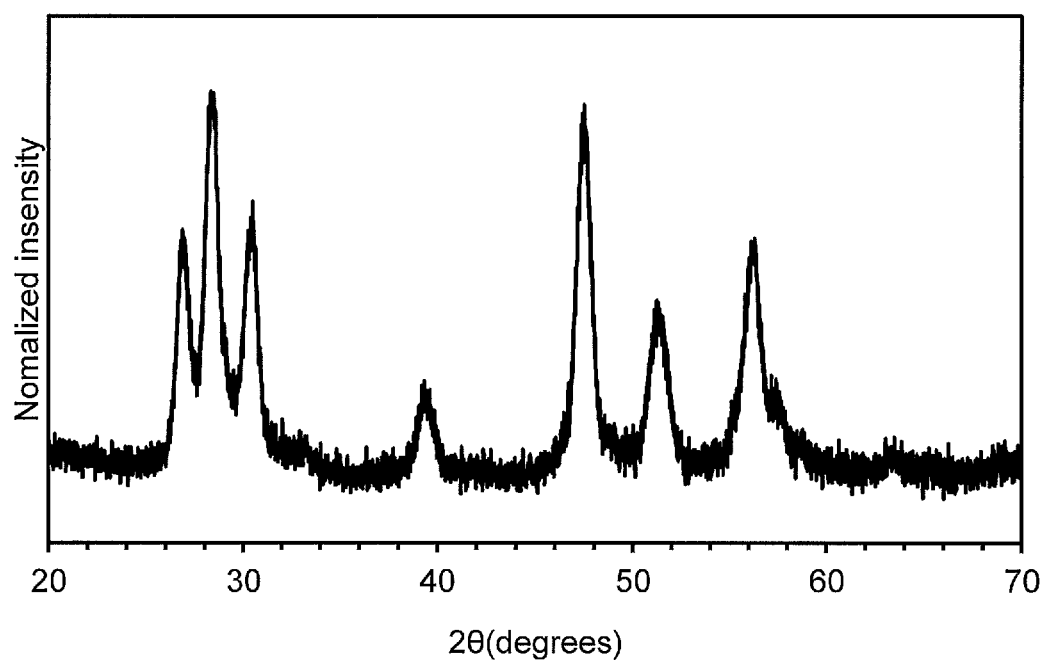
FIG. 7 is a graph showing an X-ray diffraction pattern of a sulfide according to Synthesis Example 1.

An X-ray diffraction pattern of the sulfide particles according to Synthesis Example 1 was obtained using an X-ray diffractometer (manufactured by Rigaku Corporation, product name: MiniFlex 600). CuKα radiation was used as the X-ray. The X-ray diffraction pattern of the sulfide particles according to Synthesis Example 1 is shown in FIG. 7. The X-ray diffraction pattern indicates that the sulfide particles according to Synthesis Example 1 had a wurtzite crystal structure.

TABLE 1

|  | Temperature [° C.] | Thermal conductivity [W/(m·K)] | Carrier thermal conductivity [W/(m·K)] | Lattice thermal conductivity [W/(m·K)] |
|---|---|---|---|---|
| Example 1 | 20 | 1.20 | 0.44 | 0.76 |
|  | 101 | 1.02 | 0.41 | 0.61 |
|  | 201 | 0.87 | 0.33 | 0.54 |
|  | 300 | 0.81 | 0.28 | 0.53 |
|  | 400 | 0.79 | 0.24 | 0.55 |
| Example 2 | 20 | 0.61 | 0.00 | 0.61 |
|  | 98 | 0.57 | 0.00 | 0.57 |
|  | 195 | 0.50 | 0.00 | 0.50 |
|  | 296 | 0.49 | 0.00 | 0.49 |
|  | 396 | 0.50 | 0.00 | 0.50 |
| Example 3 | 75 | 0.35 | 0.02 | 0.33 |
|  | 125 | 0.43 | 0.03 | 0.40 |
|  | 175 | 0.43 | 0.03 | 0.40 |
|  | 225 | 0.42 | 0.04 | 0.38 |
|  | 275 | 0.41 | 0.04 | 0.37 |
|  | 325 | 0.39 | 0.04 | 0.35 |
|  | 375 | 0.39 | 0.05 | 0.34 |
| Example 4 | 78 | 0.42 | 0.01 | 0.41 |
|  | 125 | 0.47 | 0.01 | 0.46 |
|  | 174 | 0.47 | 0.02 | 0.46 |
|  | 223 | 0.46 | 0.02 | 0.44 |
|  | 271 | 0.44 | 0.03 | 0.41 |
|  | 321 | 0.44 | 0.04 | 0.40 |
|  | 369 | 0.43 | 0.05 | 0.39 |
| Example 5 | 101 | 0.44 | 0.00 | 0.44 |
|  | 148 | 0.43 | 0.00 | 0.42 |
|  | 197 | 0.41 | 0.00 | 0.41 |
|  | 245 | 0.40 | 0.00 | 0.39 |
|  | 294 | 0.38 | 0.01 | 0.38 |
| Comparative Example | 344 | 0.37 | 0.01 | 0.36 |
|  | 392 | 0.35 | 0.01 | 0.35 |
|  | 20 | 1.87 | 0.87 | 1.00 |
|  | 101 | 1.67 | 0.82 | 0.85 |
|  | 201 | 1.53 | 0.67 | 0.86 |
|  | 300 | 1.50 | 0.50 | 1.00 |
|  | 400 | 1.36 | 0.40 | 0.97 |

TABLE 2

|  | Mean diameter [nm] | Ratio of particles having particle diameter of 100 nm or less [%] | Ratio of particles having particle diameter of 80 nm or less [%] | Ratio of particles having particle diameter of 60 nm or less [%] | Ratio of particles having particle diameter of 50 nm or less [%] |
|---|---|---|---|---|---|
| Example 2 | 31.4 ± 7.6 | 100 | 100 | 100 | 98 |
| Example 3 | 37.3 ± 7.1 | 100 | 100 | 100 | 98 |
| Example 4 | 21.1 ± 4.9 | 100 | 100 | 100 | 100 |
| Example 5 | 18.3 ± 2.8 | 100 | 100 | 100 | 100 |

The invention claimed is:

1. A thermoelectric material, comprising copper, tin, and sulfur, wherein
    a ratio A/B of the number A of copper atoms to the number B of tin atoms is 1 to 2.5,
    a content of a metal element other than copper and tin is 1 to 5 mol % with respect to total metal elements,
    the thermoelectric material has a thermal conductivity less than 1.0 W/(m·K) at 200 to 400° C.,
    the thermoelectric material is a sintered product,
    the thermoelectric material has a lattice thermal conductivity of 0.34 to 0.55 W/(m·K) at 200 to 400° C., and
    the lattice thermal conductivity is in a range of 0.40 to 0.46 W/(m·K) at 125° C.

2. A thermoelectric material, comprising copper, tin, and sulfur, wherein
    a ratio A/B of the number A of copper atoms to the number B of tin atoms is 1 to 2.5,
    a content of a metal element other than copper and tin is 1 to 5 mol % with respect to total metal elements,
    the thermoelectric material has a lattice thermal conductivity less than 0.8 W/(m·K) at 80 to 200° C.,
    the lattice thermal conductivity is in a range of 0.34 to 0.55 W/(m·K) at 200 to 400° C.,
    the lattice thermal conductivity is in a range of 0.40 to 0.46 W/(m·K) at 125° C., and
    the thermoelectric material is a sintered product.

3. The thermoelectric material according to claim 1, having a crystal grain size of 100 nm or less.

4. A thermoelectric conversion device, comprising:
    the thermoelectric material according to claim 1; and
    a conductor connected to the thermoelectric material.

5. A sintered product of powder for a thermoelectric material, comprising copper, tin, and sulfur, wherein
    a ratio A/B of the number A of copper atoms to the number B of tin atoms is 1 to 2.5,
    a content of a metal element other than copper and tin is 1 to 5 mol % with respect to total metal elements, the powder for a thermoelectric material comprises particles having a particle diameter of 100 nm or less in an amount of 80% or more on a number basis, the sintered product has a lattice thermal conductivity of 0.55 W/(m·K) or less at 400° C., and the lattice thermal conductivity is in a range of 0.40 to 0.46 W/(m·K) at 125° C.

6. A method for producing a thermoelectric material, comprising:

adding a copper compound, a tin compound, and a sulfur compound or a simple substance of sulfur to water under stirring to prepare a liquid mixture so that a ratio A/B of the number A of copper atoms to the number B of tin atoms is 0.5 to 2.5; and placing the liquid mixture in an environment having a temperature of 150 to 300° C. and a pressure of 0.5 to 9 MPa for a 4 hours to 100 hours to carry out hydrothermal synthesis of a thermoelectric material.

7. The method for producing a thermoelectric material according to claim 6, wherein the sulfur compound is an organic sulfur compound.

8. A method for producing a thermoelectric material, comprising:

preparing a liquid mixture comprising a copper compound, a tin compound, and a sulfur compound and/or a simple substance of sulfur in an organic solvent so that a ratio AB of the number A of copper atoms to the number B of tin atoms is 1 to 2.5;

placing the liquid mixture in an environment filled with an inert gas and having a temperature of 150 to 350° C. for a predetermined period of time to carry out synthesis of a thermoelectric material; and sintering the thermoelectric material to have a lattice thermal conductivity of 0.55 W/(m·K) or less at 400° C., the lattice thermal conductivity further being in a range of 0.40 to 0.46 W/(m·K) at 125° C., and a content of a metal element other than copper and tin being 1 to 5 mol % with respect to total metal elements.

9. The method for producing a thermoelectric material according to claim 8, wherein the sulfur compound is an organic sulfur compound.

10. The method for producing a thermoelectric material according to claim 9, wherein the organic sulfur compound is a liquid organic sulfur compound.

11. The thermoelectric material according to claim 2, having a crystal grain size of 100 nm or less.

12. The thermoelectric material according to claim 3, wherein the thermoelectric material is formed as particles having a mean crystal grain size of 5 nm to 100 nm, and the mean crystal grain is determined on a number basis.

13. The thermoelectric material according to claim 11, wherein the thermoelectric material is formed as particles having a mean crystal grain size of 5 nm to 100 nm, and the mean crystal grain is determined on a number basis.

* * * * *